(12) United States Patent
Wang et al.

(10) Patent No.: US 11,545,412 B2
(45) Date of Patent: Jan. 3, 2023

(54) PACKAGE STRUCTURE AND MANUFACTURING METHOD THEREOF

(71) Applicant: Unimicron Technology Corp., Taoyuan (TW)

(72) Inventors: Pei-Wei Wang, Taipei (TW); Ching Sheng Chen, Hsinchu County (TW); Ra-Min Tain, Hsinchu County (TW); Ming-Hao Wu, Taoyuan (TW); Hsuan-Wei Chen, New Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 79 days.

(21) Appl. No.: 16/952,080

(22) Filed: Nov. 19, 2020

(65) Prior Publication Data
US 2021/0074606 A1     Mar. 11, 2021

Related U.S. Application Data

(63) Continuation-in-part of application No. 16/145,130, filed on Sep. 27, 2018, now abandoned.
(Continued)

(30) Foreign Application Priority Data

Jul. 27, 2018   (TW) .................................. 107126005
Oct. 28, 2020   (TW) .................................. 109137405

(51) Int. Cl.
*H01L 21/48*     (2006.01)
*H01L 23/373*    (2006.01)
*H01L 23/498*    (2006.01)

(52) U.S. Cl.
CPC ........ *H01L 23/3733* (2013.01); *H01L 21/486* (2013.01); *H01L 21/4857* (2013.01); *H01L 23/49822* (2013.01); *H01L 23/49827* (2013.01)

(58) Field of Classification Search
CPC ......... H05K 3/4644; H05K 2201/0323; H05K 2201/068; H01L 23/49822; H01L 23/373; H01L 21/4857; H01L 2924/15153
See application file for complete search history.

(56) References Cited

U.S. PATENT DOCUMENTS

2009/0113705 A1* 5/2009 McKinley ............ H05K 1/0353
                                                                29/830

FOREIGN PATENT DOCUMENTS

CN   101609830   12/2009
CN   106993394    7/2017
(Continued)

OTHER PUBLICATIONS

Jagannadham, K., abstract of "Thermal conductivity of copper-graphene composite films synthesized by electrochemical deposition with exfoliated graphene platelets", Apr. 2012, Metallurgical and Materials Transactions B, vol. 43, Issue 2, pp. 1.
(Continued)

*Primary Examiner* — Meiya Li
(74) *Attorney, Agent, or Firm* — JCIPRNET

(57) ABSTRACT

A package structure including a circuit board and a heat generating element is provided. The circuit board includes a plurality of circuit layers and a composite material layer. A thermal conductivity of the composite material layer is between 450 W/mK and 700 W/mK. The heat generating element is disposed on the circuit board and electrically connected to the circuit layers. Heat generated by the heat generating element is transmitted to an external environment through the composite material layer.

14 Claims, 11 Drawing Sheets

Related U.S. Application Data

(60) Provisional application No. 62/645,784, filed on Mar. 20, 2018.

(56) References Cited

FOREIGN PATENT DOCUMENTS

| | | |
|---|---|---|
| TW | 201032302 | 9/2010 |
| TW | 201627420 | 8/2016 |
| TW | 201911984 | 3/2019 |

OTHER PUBLICATIONS

"Office Action of Taiwan Counterpart Application", dated May 12, 2021, p. 1-p. 6.

* cited by examiner

PACKAGE STRUCTURE AND MANUFACTURING METHOD THEREOF

CROSS-REFERENCE TO RELATED APPLICATION

This application is a continuation-in-part application of and claims the priority benefit of U.S. application Ser. No. 16/145,130, filed on Sep. 27, 2018, now. The prior U.S. application Ser. No. 16/145,130 claims the priority benefits of U.S. provisional application Ser. No. 62/645,784, filed on Mar. 20, 2018, and Taiwan application serial no. 107126005, filed on Jul. 27, 2018. This application also claims the priority benefit of Taiwan application serial no. 109137405, filed on Oct. 28, 2020. The entirety of each of the above-mentioned patent applications is hereby incorporated by reference herein and made a part of this specification.

BACKGROUND

Technical Field

The disclosure relates to a semiconductor structure and a manufacturing method thereof, and particularly relates to a package structure and a manufacturing method thereof.

Description of Related Art

In an every layer interconnection count (ELIC) circuit board structure, it is difficult for a circuit layer to have a heat dissipation or heat transfer effect. In order to solve the above-mentioned problem, currently, a heat source may be led out in a vertical direction (i.e., a Z direction) by 1.) forming thermal pads/bars/x-vias by copper electroplating; 2.) embedding copper blocks; 3.) adopting a metal core, etc. Regarding the means of forming the thermal pads/bars/x-vias by copper electroplating, a size of a heat conduction path thereof is limited by an electroplating capacity. Furthermore, regarding the means of embedding copper blocks, the copper blocks are used to conduct heat to the vertical direction, which is not suitable for a structure with a too thin thickness of dielectric layer. In addition, regarding the means of adopting metal as a core layer material, although it may implement horizontal heat transfer, it is also necessary to guide the heat source to an underlying metal core through a blind hole, which belongs to an indirect contact heat transfer. Namely, regarding a multilayer board structure, a vertical heat transfer path may be blocked by other layers and cannot contact the outside in a large area, and the heat source will be limited to a center of the board, resulting in a limited heat dissipation effect.

SUMMARY

The disclosure is directed to a package structure, which has a better heat transfer effect.

The disclosure is directed to a manufacturing method of a package structure, for manufacturing the aforementioned package structure, which has a better heat transfer effect.

The disclosure provides a package structure including a circuit board and a heat generating element. The circuit board includes a plurality of circuit layers and a composite material layer. A thermal conductivity of the composite material layer is between 450 W/mK and 700 W/mK. The heat generating element is disposed on the circuit board and electrically connected to the circuit layers. Heat generated by the heat generating element is transferred to the external environment through the composite material layer.

In an embodiment of the disclosure, the composite material layer includes a first material and a second material. A thermal conductivity of the first material is greater than a thermal conductivity of the second material.

In an embodiment of the disclosure, the first material is graphene, and the second material is copper.

In an embodiment of the disclosure, the circuit layers include an inner circuit layer, at least one first build-up circuit layer and at least one second build-up circuit layer. The circuit board includes a core substrate, a first build-up structure and a second build-up structure. The core substrate includes a core layer, the composite material layer and the inner circuit layer. The composite material layer and the inner circuit layer are respectively located on two opposite sides of the core layer. The first build-up structure is disposed on one side of the core substrate and includes at least one first dielectric layer, the at least one first build-up circuit layer and an opening. The first dielectric layer is located between the first build-up circuit layer and the composite material layer. The opening extends from the first build-up circuit layer to the composite material layer and exposes a part of the composite material layer. The heat generating element is disposed in the opening. The second build-up structure is disposed on the other side of the core substrate and includes at least one second dielectric layer and the at least one second build-up circuit layer. The second dielectric layer is located between the at least one second build-up circuit layer and the inner circuit layer.

In an embodiment of the disclosure, the package structure further includes an insulating adhesive layer and an electrical connection layer. The insulating adhesive layer is arranged between the opening and the heat generating element. The heat generating element has an active surface and a back surface opposite to each other, and a peripheral surface connecting the active surface and the back surface, and includes a first electrode and a second electrode on the active surface. The insulating adhesive layer covers the back surface and the peripheral surface of the heat generating element. The heat generating element contacts the composite material layer through the insulating adhesive layer. The electrical connection layer connects the first build-up circuit layer and the first electrode of the heat generating element, and connects the first build-up circuit layer and the second electrode of the heat generating element. The electrical connection layer exposes a part of the active surface of the heat generating element and a part of the first dielectric layer of the first build-up structure.

In an embodiment of the disclosure, the package structure further includes a conductive via that penetrates through the first dielectric layer of the first build-up structure, the core layer of the core substrate, and the second dielectric layer of the second build-up structure, and electrically connects the first build-up circuit layer and the second build-up circuit layer.

In an embodiment of the disclosure, the heat generating element has an active surface and a back surface opposite to each other, and includes a first electrode and a second electrode on the active surface. The composite material layer includes a first composite material part and a second composite material part separated from each other. The first electrode is structurally and electrically connected to the first composite material part. The second electrode is structurally and electrically connected to the second composite material part.

In an embodiment of the disclosure, the package structure further includes a third build-up structure and a fourth build-up structure. The third build-up structure is disposed on the first build-up structure and is electrically connected to the first build-up circuit layer. The fourth build-up structure is disposed on the second build-up structure and is electrically connected to the second build-up circuit layer.

In an embodiment of the disclosure, the circuit layers include a first circuit layer, a second circuit layer, and a third circuit layer. The circuit board has a through hole and further includes a core substrate, a first build-up structure, a second build-up structure, and a conductive connection layer. The core substrate includes a core dielectric layer and the first circuit layer and the second circuit layer located on two opposite sides of the core dielectric layer. The first build-up structure is disposed on the first circuit layer of the core substrate. The first build-up structure includes a first dielectric layer and the composite material layer. The first dielectric layer is located between the composite material layer and the first circuit layer. The second build-up structure is disposed on the second circuit layer of the core substrate. The second build-up structure includes a second dielectric layer and the third circuit layer. The second dielectric layer is located between the second circuit layer and the third circuit layer, and the through hole penetrates through the first build-up structure, the core substrate and the second build-up structure. The conductive connection layer is disposed on an inner wall of the through hole and is electrically connected to the composite material layer, the first circuit layer, the second circuit layer, and the third circuit layer.

In an embodiment of the disclosure, the package structure further includes a solder mask layer disposed on the circuit board and located between the heat generating element and the composite material layer. The solder mask layer fills the through hole and covers the conductive connection layer, the composite material layer and the third circuit layer, and exposes a part of the composite material layer and a part of the third circuit layer.

In an embodiment of the disclosure, the heat generating element is disposed on the composite material layer exposed by the solder mask layer. The heat generating element has an active surface and a back surface opposite to each other, and includes a first electrode and a second electrode on the active surface. The composite material layer includes a first composite material part and a second composite material part separated from each other. The first electrode is structurally and electrically connected to the first composite material part, and the second electrode is structurally connected to the second composite material part.

The disclosure provides a manufacturing method of a package structure including following steps. A circuit board is provided. The circuit board includes a plurality of circuit layers and a composite material layer, wherein a thermal conductivity of the composite material layer is between 450 W/mK and 700 W/mK. A heat generating element is disposed on the circuit board. The heat generating element is electrically connected to the circuit layers, wherein heat generated by the heat generating element is transferred to the external environment through the composite material layer.

In an embodiment of the disclosure, the composite material layer includes a first material and a second material. A thermal conductivity of the first material is greater than a thermal conductivity of the second material.

In an embodiment of the disclosure, the first material is graphene, and the second material is copper.

In an embodiment of the disclosure, the circuit layers include an inner circuit layer, at least one first build-up circuit layer and at least one second build-up circuit layer. The step of providing the circuit board includes following steps. A core substrate is provided. The core substrate includes a core layer, the composite material layer and the inner circuit layer. The composite material layer and the inner circuit layer are respectively located on two opposite sides of the core layer. A first build-up structure is formed on one side of the core substrate. The first build-up structure includes at least one first dielectric layer and the first build-up circuit layer. The first dielectric layer is located between the first build-up circuit layer and the composite material layer. An opening is formed to extend from the first build-up circuit layer to the composite material layer and expose a part of the composite material layer. A second build-up structure is formed on the other side of the core substrate. The second build-up structure includes at least one second dielectric layer and the at least one second build-up circuit layer. The second dielectric layer is located between the at least one second build-up circuit layer and the inner circuit layer.

In an embodiment of the disclosure, the manufacturing method of the package structure further includes following steps. An insulating adhesive layer is provided in the opening after the opening is formed and before the heat generating element is disposed on the circuit board. The heat generating element is disposed in the opening. The heat generating element has an active surface and a back surface opposite to each other, and a peripheral surface connecting the active surface and the back surface, and includes a first electrode and a second electrode on the active surface. The insulating adhesive layer covers the back surface and the peripheral surface of the heat generating element. The heat generating element contacts the composite material layer through the insulating adhesive layer. An electrical connection layer is formed to connect the first build-up circuit layer and the first electrode of the heat generating element and connect the first build-up circuit layer and the second electrode of the heat generating element. The electrical connection layer exposes a part of the active surface of the heat generating element and a part of the first dielectric layer of the first build-up structure.

In an embodiment of the disclosure, the manufacturing method of the package structure further includes following steps. A conductive via penetrating through the first dielectric layer of the first build-up structure, the core layer of the core substrate, and the second dielectric layer of the second build-up structure is formed. The conductive via electrically connects the first build-up circuit layer and the second build-up circuit layer.

In an embodiment of the disclosure, the manufacturing method of the package structure further includes following steps. The heat generating element is disposed in the opening. The heat generating element has an active surface and a back surface opposite to each other, and includes a first electrode and a second electrode on the active surface. The composite material layer includes a first composite material part and a second composite material part separated from each other. The first electrode is structurally and electrically connected to the first composite material part. The second electrode is structurally and electrically connected to the second composite material part.

In an embodiment of the disclosure, the manufacturing method of the package structure further includes following steps. A third build-up structure is formed on the first build-up structure after the first build-up structure is formed. The third build-up structure is electrically connected to the first build-up circuit layer. A fourth build-up structure is formed on the second build-up structure after the second build-up structure is formed. The second build-up structure is electrically connected to the second build-up circuit layer.

In an embodiment of the disclosure, the circuit layers include a first circuit layer, a second circuit layer, and a third circuit layer. The step of providing the circuit board includes following steps. A core substrate is provided. The core substrate includes a core dielectric layer and the first circuit layer and the second circuit layer located on two opposite sides of the core dielectric layer. A first build-up structure is formed on the first circuit layer of the core substrate. The first build-up structure includes a first dielectric layer and the composite material layer. The first dielectric layer is located between the composite material layer and the first circuit layer. A second build-up structure is formed on the second circuit layer of the core substrate. The second build-up structure includes a second dielectric layer and the third circuit layer. The second dielectric layer is located between the second circuit layer and the third circuit layer. A through hole is formed to penetrate through the first build-up structure, the core substrate and the second build-up structure. A conductive connection layer is formed on an inner wall of the through hole to electrically connect the composite material layer, the first circuit layer, the second circuit layer, and the third circuit layer.

In an embodiment of the disclosure, the manufacturing method of the package structure further includes following steps. A solder mask layer is formed on the circuit board before the heat generating element is disposed on the circuit board. The solder mask layer fills the through hole and covers the conductive connection layer, the composite material layer and the third circuit layer, and exposes a part of the composite material layer and a part of the third circuit layer.

In an embodiment of the disclosure, the step of disposing the heat generating element on the circuit board includes disposing the heat generating element on the composite material layer exposed by the solder mask layer. The heat generating element has an active surface and a back surface opposite to each other, and includes a first electrode and a second electrode on the active surface. The composite material layer includes a first composite material part and a second composite material part separated from each other. The first electrode is structurally and electrically connected to the first composite material part, and the second electrode is structurally connected to the second composite material part.

Based on the above description, in the design of the package structure of the disclosure, the circuit board includes the composite material layer with a thermal conductivity between 450 W/mK and 700 W/mK, and the heat generated by the heat generating element may be transferred to the external environment through the composite material layer. Namely, the package structure of the disclosure transfers the heat generated by the heat generating element to the external environment in a horizontal direction through the composite material layer with the thermal conductivity greater than that of copper (400 W/mK), so that in addition to quickly transferring the heat to the external environment, better heat dissipation efficiency is also achieved.

To make the aforementioned more comprehensible, several embodiments accompanied with drawings are described in detail as follows.

DESCRIPTION OF THE EMBODIMENTS

FIG. 1A to FIG. 1G are schematic cross-sectional views of a manufacturing method of a package structure according to an embodiment of the disclosure. Regarding the manufacturing method of the package structure of the embodiment, first, referring to FIG. 1A, a core substrate C1 is provided. The core substrate C1 includes a core layer 111$a$, a composite material layer 112$a$, and an inner circuit layer 114$a$1. The composite material layer 112$a$ and the inner circuit layer 114$a$1 are respectively located on two opposite sides of the core layer 111$a$. Here, a thermal conductivity of the composite material layer 112$a$ is, for example, between 450 W/mK and 700 W/mK, where the composite material layer 112$a$ includes a first material and a second material, and a thermal conductivity of the first material is greater than a thermal conductivity of the second material. Preferably, the first material is, for example, graphene, and the second material is, for example, copper. In other words, the thermal conductivity of the composite material layer 112$a$ of the embodiment is greater than the thermal conductivity of copper (400 W/mK). In addition, a resistivity of the composite material layer 112$a$ (2×10−8 m) is lower than a resistivity of copper (1.7$x$10-8 SZ m), which means that the composite material layer 112$a$ is conductive. A coefficient of thermal expansion (CTE) of the composite material layer 112$a$ is similar to that of copper, which is approximately equal to 16 ppm/° C. to 17 ppm/° C., and a hardness thereof is approximately 71 Hv to 75 Hv. The composite material layer 112$a$ is made by means of pulse reverse electrodeposition (PRED).

Figure 1A:
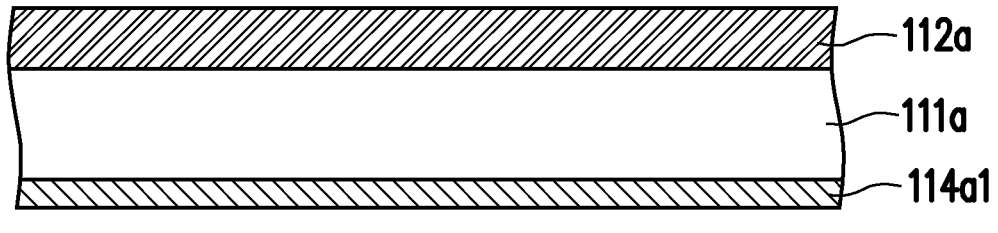
FIG. 1A to FIG. 1G are schematic cross-sectional views of a manufacturing method of a package structure according to an embodiment of the disclosure.
Figure 1B:
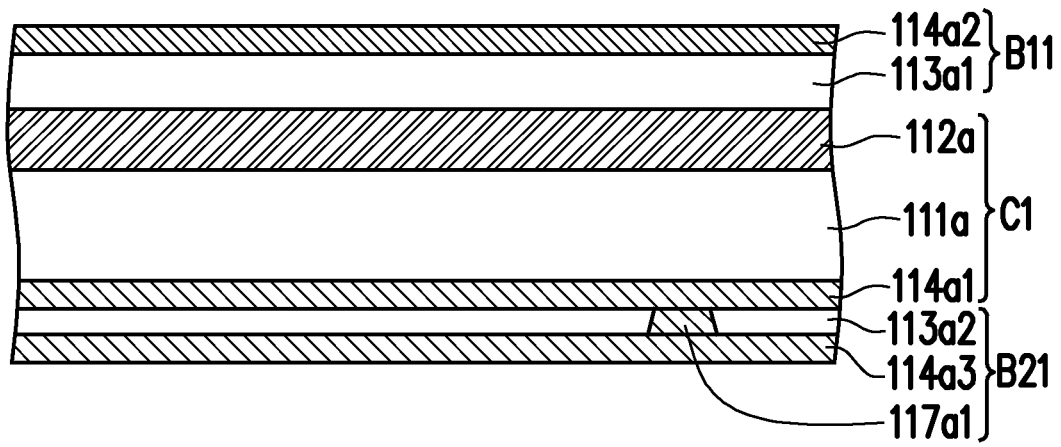

Then, referring to FIG. 1B, a first build-up structure B11 and a second build-up structure B21 are formed by lamination, which are disposed on two opposite sides of the core substrate C1. The first build-up structure B11 includes at least one first dielectric layer (one first dielectric layer 113$a$1 is schematically shown) and at least one first build-up circuit layer (one first build-up circuit layer 114$a$2 is schematically shown), where the first dielectric layer 113$a$1 is located between the first build-up circuit layer 114$a$2 and the composite material layer 112$a$. The second build-up structure B21 includes at least one second dielectric layer (one second dielectric layer 113$a$2 is schematically shown), a second build-up circuit layer (one second build-up circuit layer 114$a$3 is schematically shown) and at least one conductive via (one conductive via 117$a$1 is schematically shown), where the second dielectric layer 113$a$2 is located between the second build-up circuit layer 114$a$3 and the inner circuit layer 114$a$1, and the second build-up circuit layer 114$a$3 is electrically connected to the inner circuit layer 114$a$1 through the conductive via 117$a$1. In other words, a plurality of circuit layers include an inner circuit layer 114$a$1, a first build-up circuit layer 114$a$2, and a second build-up circuit layer 114$a$3, where a material of the inner circuit layer 114$a$1, a material of the first build-up circuit layer 114$a$2, and a material of the second build-up circuit layer 114$a$3 are, for example, copper. Currently, a circuit board 110a including a plurality of circuit layers and the composite material layer 112a has been provided. Preferably, as shown in FIG. 1B, a thickness of the composite material layer 112a of the embodiment is greater than a thickness of the inner circuit layer 114a1, a thickness of the first build-up circuit layer 114a2, and a thickness of the second build-up circuit layer 114a3.

Figure 1C:
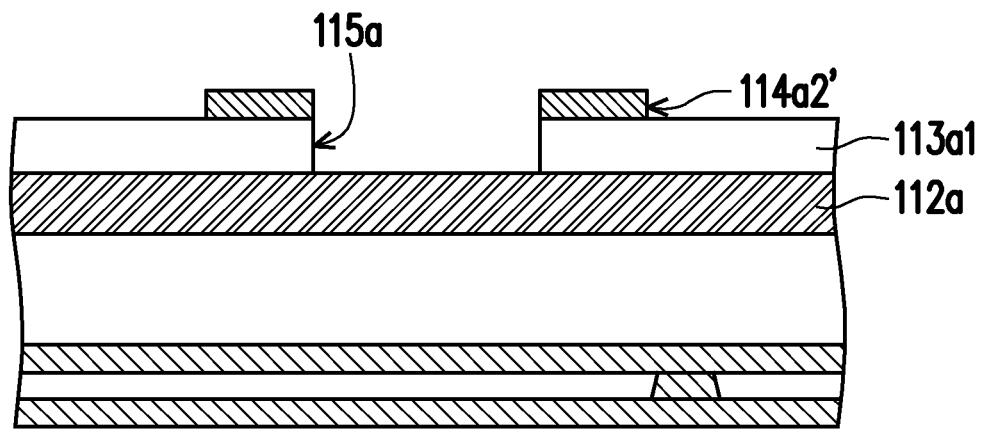

Then, referring to FIG. 1B and FIG. 1C, a photolithography process such as exposure, development, etching etc., is performed on the first build-up structure B11 to form a patterned first build-up circuit layer 114a2' exposing a part of the first dielectric layer 113a1, and an opening 115a that extends from the first build-up circuit layer 114a2' to the composite material layer 112a and exposes a part of the composite material layer 112a.

Figure 1D:
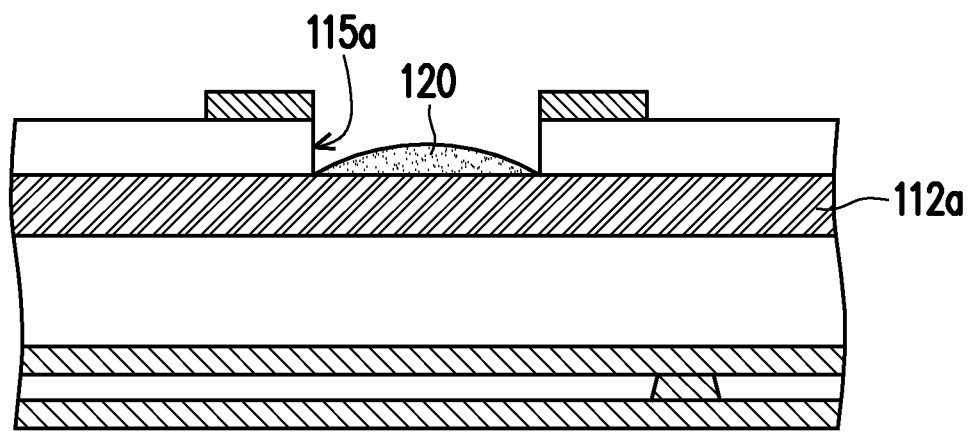

Then, referring to FIG. 1D, an insulating adhesive layer 120 is provided in the opening 115a. Here, the insulating adhesive layer 120 is directly located on the composite material layer 112a exposed by the opening 115a. The insulating adhesive layer 120 has adhesion and insulation effects.

Figure 1E:
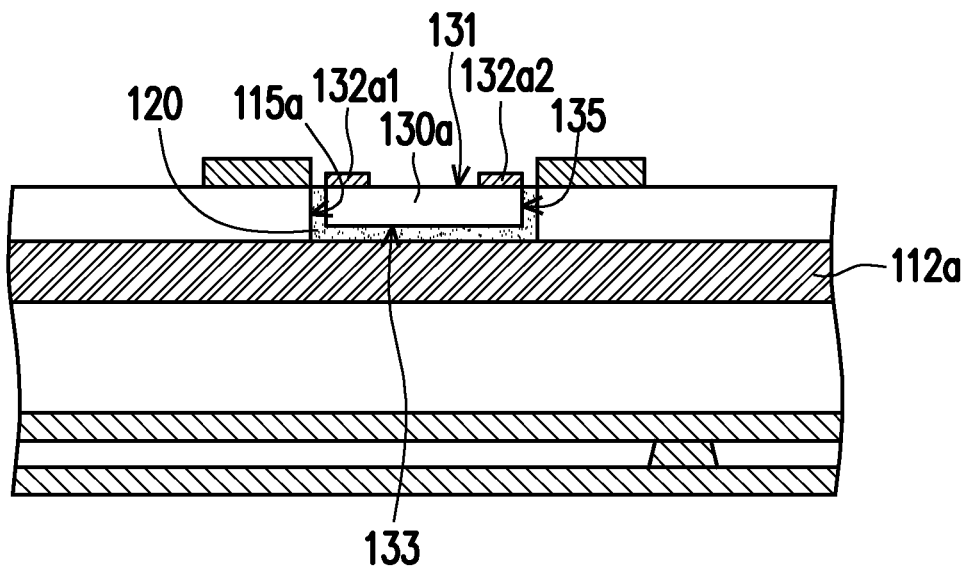

Then, referring to FIG. 1E, a heat generating element 130a is arranged in the opening 115a. In detail, the heat generating element 130a has an active surface 131 and a back surface 133 opposite to each other, and a peripheral surface 135 connecting the active surface 131 and the back surface 133, and includes a first electrode 132a1 and a second electrode 132a2 on the active surface 131. The heat generating element 130a is disposed in the opening 115a with the active surface 131 facing upward, and is fixed in the opening 115a through the insulating adhesive layer 120. The insulating adhesive layer 120 covers the back surface 133 and the peripheral surface 135 of the heat generating element 130a, and the heat generating element 130a contacts the composite material layer 112a through the insulating adhesive layer 120. The heat generating element 130a may be, for example, an electronic chip or a photoelectric element, but the disclosure is not limited thereto. The electronic chip may be an integrated circuit chip, for example, a single chip such as a graphics chip, a memory chip, a semiconductor chip, etc., or a chip module. The photoelectric element is, for example, a light emitting diode (LED), a laser diode, or a gas discharge light source. Certainly, the heat generating element 130a may also be any heating object such as a running motor or heater, etc. In the embodiment, the heat generating element 130a is, for example, a semiconductor chip.

Figure 1F:
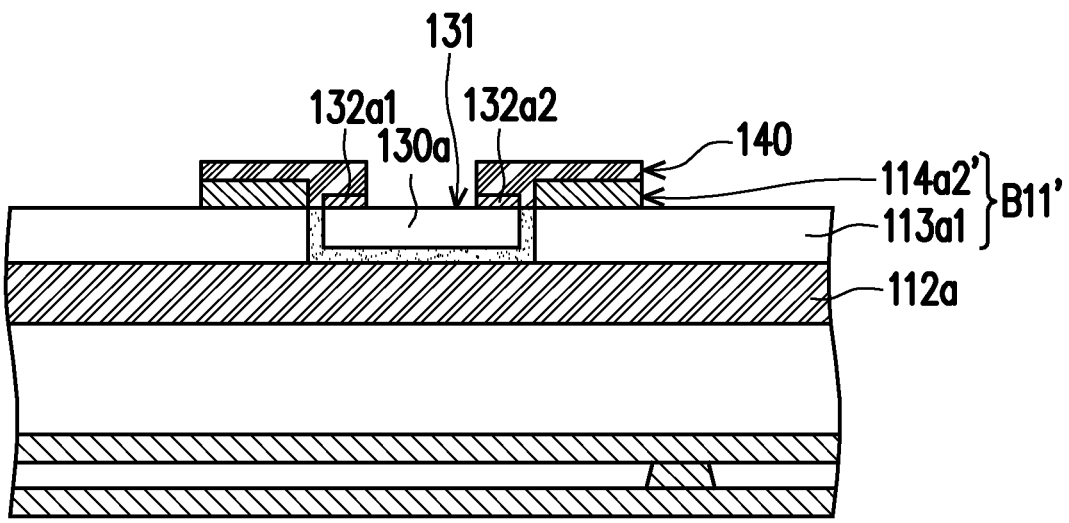

Then, referring to FIG. 1F, an electrical connection layer 140 is formed to connect the first build-up circuit layer 114a2' and the first electrode 132a1 of the heat generating element 130a and connect the first build-up circuit layer 114a2' and the second electrode 132a2 of the heat generating element 130a. The electrical connection layer 140 exposes a part of the active surface 131 of the heat generating element 130a and a part of the first dielectric layer 113a1 of the first build-up structure B11'. The heat generating element 130a is disposed on the circuit board 110a, and is electrically connected to the circuit layer (i.e., the first build-up circuit layer 114a2') through the electrical connection layer 140, where the heat generated by the heat generating element 130a is transmitted to the external environment through the composite material layer 112a. Namely, the electricity of the heat generating element 130a is transferred by the electrical connection layer 140, and the heat of the heat generating element 130a is transferred by the composite material layer 112a. In other words, the composite material layer 112a only has a function of heat dissipation, but does not have a function of conducting electricity.

Figure 1G:
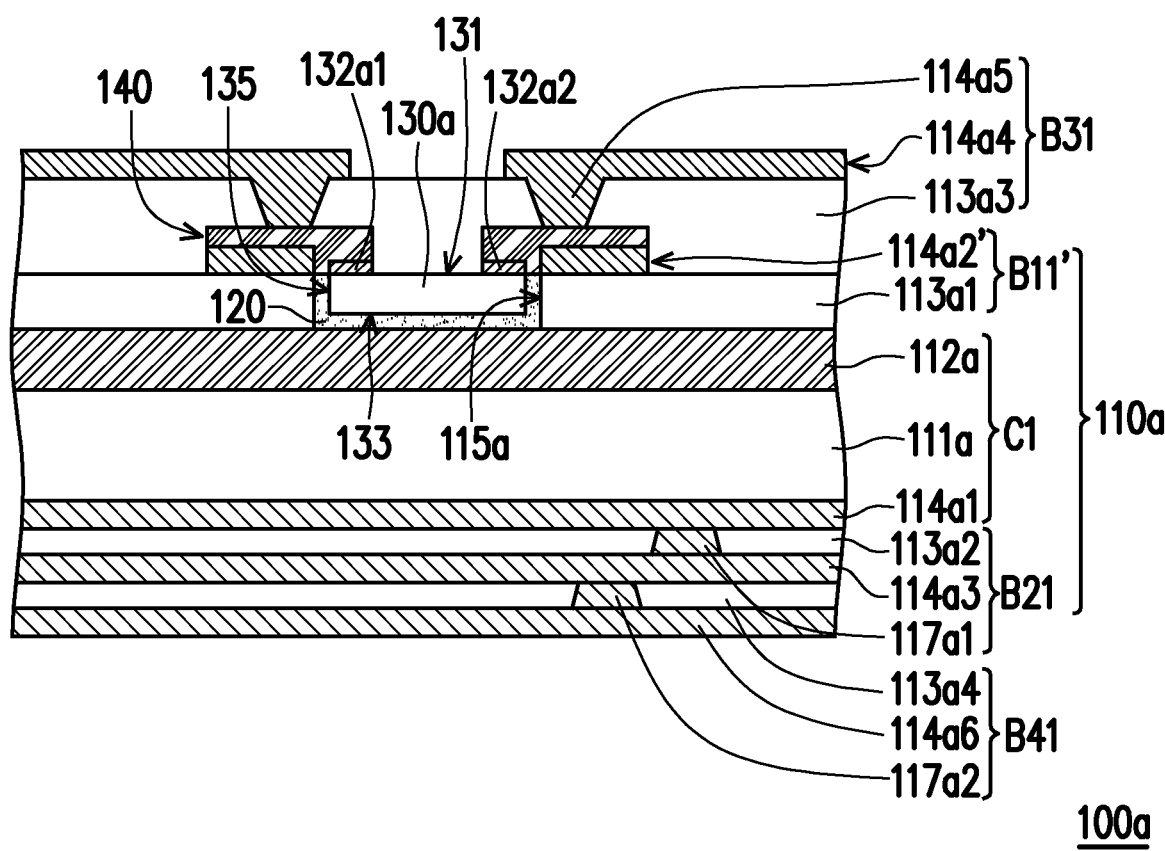

Finally, referring to FIG. 1G, a third build-up structure B31 is formed on the first build-up structure B11' by lamination, and a fourth build-up structure B41 is formed on the second build-up structure B21 by lamination. The third build-up structure B31 includes at least one dielectric layer (one dielectric layer 113a3 is schematically shown), at least one circuit layer (one circuit layer 114a4 is schematically shown), and a plurality of conductive vias 114a5, where the circuit layer 114a4 is electrically connected to the first build-up circuit layer 114a2' through the conductive vias 114a5 and the electrical connection layer 140. The fourth build-up structure B41 includes at least one dielectric layer (one dielectric layer 113a4 is schematically shown), at least one circuit layer (one circuit layer 114a6 is schematically shown), and at least one conductive via (one conductive via 117a2 is schematically shown), where the dielectric layer 113a4 is located between the second build-up circuit layer 114a3 and the circuit layer 114a6, and the circuit layer 114a6 is electrically connected to the second build-up circuit layer 114a3 through the conductive via 117a2. So far, the package structure 100a with embedded components is completed.

In terms of structure, referring to FIG. 1G again, the package structure 100a of the embodiment includes the circuit board 110a and the heat generating element 130a. The circuit board 110a includes a plurality of circuit layers and the composite material layer 112a, where the circuit layers include the inner circuit layer 114a1, the first build-up circuit layer 114a2', and the second build-up circuit layer 114a3. The thermal conductivity of the composite material layer 112a is between 450 W/mK and 700 W/mK. The heat generating element 130a is disposed on the circuit board 110a and is electrically connected to the circuit layer (i.e., the first build-up circuit layer 114a2'). The heat generated by the heat generating element 130a is transmitted to the external environment through the composite material layer 112a.

To be more specific, the circuit board 110a of the embodiment includes the core substrate C1, the first build-up structure B11', and the second build-up structure B21. The core substrate C1 includes the core layer 111a, the composite material layer 112a, and the inner circuit layer 114a1. The composite material layer 112a and the inner circuit layer 114a1 are respectively located on the two opposite sides of the core layer 111a. The composite material layer 112a includes a first material and a second material, where the thermal conductivity of the first material is greater than the thermal conductivity of the second material. Preferably, the first material is graphene, and the second material is copper. The first build-up structure B11' is disposed on one side of the core substrate C1, and includes the first dielectric layer 113a1, the first build-up circuit layer 114a2' and the opening 115a. The first dielectric layer 113a1 is located between the first build-up circuit layer 114a2' and the composite material layer 112a. The opening 115a extends from the first build-up circuit layer 114a2' to the composite material layer 112a, and exposes a part of the composite material layer 112a. The heat generating element 130a is disposed in the opening 115a and located on the composite material layer 112a exposed by the opening 115a. The second build-up structure B21 is disposed on the other side of the core substrate C1 and includes the second dielectric layer 113a2, the second build-up circuit layer 114a3, and the conductive via 117a1. The second dielectric layer 113a2 is located between the second build-up circuit layer 114a3 and the inner circuit layer 114a1, and the second build-up circuit layer 114a3 is electrically connected to the inner circuit layer 114a1 through the conductive via 117a1.

Moreover, the package structure 100a of the embodiment further includes the insulating adhesive layer 120 and the electrical connection layer 140. The insulating adhesive layer 120 is disposed between the opening 115a and the heat generating element 130a. The heat generating element 130a has the active surface 131 and the back surface 133 opposite to each other, and the peripheral surface 135 connecting the active surface 131 and the back surface 133, and includes the first electrode 132a1 and the second electrode 132a2 on the active surface 131. The insulating adhesive layer 120 covers the back surface 133 and the peripheral surface 135 of the heat generating element 130a, and the heat generating element 130a contacts the composite material layer 112a through the insulating adhesive layer 120. The electrical connection layer 140 connects the first build-up circuit layer 114a2' and the first electrode 132a1 of the heat generating element 130a, and connects the first build-up circuit layer 114a2' and the second electrode 132a2 of the heat generating element 130a. The electrical connection layer 140 exposes a part of the active surface 131 of the heat generating element 130a and a part of the first dielectric layer 113a1 of the first build-up structure B11'.

In addition, the package structure 100a of the embodiment further includes the third build-up structure B31 and the fourth build-up structure B41. The third build-up structure B31 is disposed on the first build-up structure B11', and is electrically connected to the first build-up circuit layer 114a2'. The third build-up structure B31 includes the dielectric layer 113a3, the circuit layer 114a4, and the conductive vias 114a5, where the circuit layer 114a4 is electrically connected to the first build-up circuit layer 114a2' through the conductive vias 114a5 and the electrical connection layer 140. The fourth build-up structure B41 is disposed on the second build-up structure B21 and is electrically connected to the second build-up circuit layer 114a3. The fourth build-up structure B41 includes the dielectric layer 113a4, the circuit layer 114a6, and the conductive via 117a2, where the dielectric layer 113a4 is located between the second build-up circuit layer 114a3 and the circuit layer 114a6, and the circuit layer 114a6 is electrically connected to the second build-up circuit layer 114a3 through the conductive via 117a2.

In brief, in the design of the package structure of the embodiment, the circuit board 110a includes the composite material layer 112a with a thermal conductivity between 450 W/mK and 700 W/mK, and the heat generated by the heat generating element 130a may be transferred to the external environment through the composite material layer 112a. In other words, the package structure 100a of the embodiment transmits the heat generated by the heat generating element 130a to the external environment in a horizontal direction through the composite material layer 112a with the thermal conductivity greater than copper (400 W/mK). Therefore, compared with the conventional method of leading the heat source out in a vertical direction (i.e. the Z direction) by forming thermal pads/bars/x-vias through coper electroplating or embedding copper blocks or using metal cores, the thermal conductivity of the composite material layer 112a of the embodiment is greater than that of copper, so that it may lead thermal energy out faster in the horizontal direction than in the vertical direction. Therefore, the package structure 100a of the embodiment may not only lead heat out more quickly, but also has better heat dissipation efficiency. In addition, in the package structure 100a of the embodiment, the heat generated by the heat generating element 130a is transferred to the external environment through the composite material layer 112a, and electricity of the heat generating element 130a is transferred through the electrical connection layer 140, thus forming a heat-electricity separation structure.

It should be noted that reference numbers of the components and a part of contents of the aforementioned embodiment are also used in the following embodiment, wherein the same reference numbers denote the same or like components, and descriptions of the same technical contents are omitted. The aforementioned embodiment may be referred for descriptions of the omitted parts, and detailed descriptions thereof are not repeated in the following embodiment.

Figure 2A:
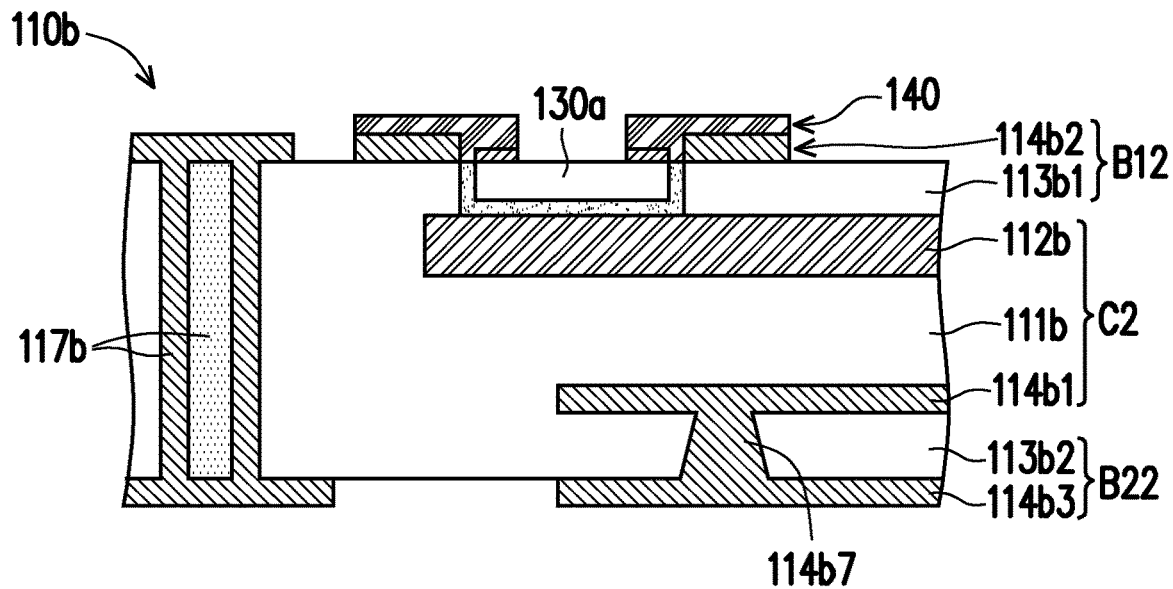
FIG. 2A to FIG. 2B are schematic cross-sectional views showing partial steps of a manufacturing method of a package structure according to another embodiment of the disclosure.
Figure 2B:
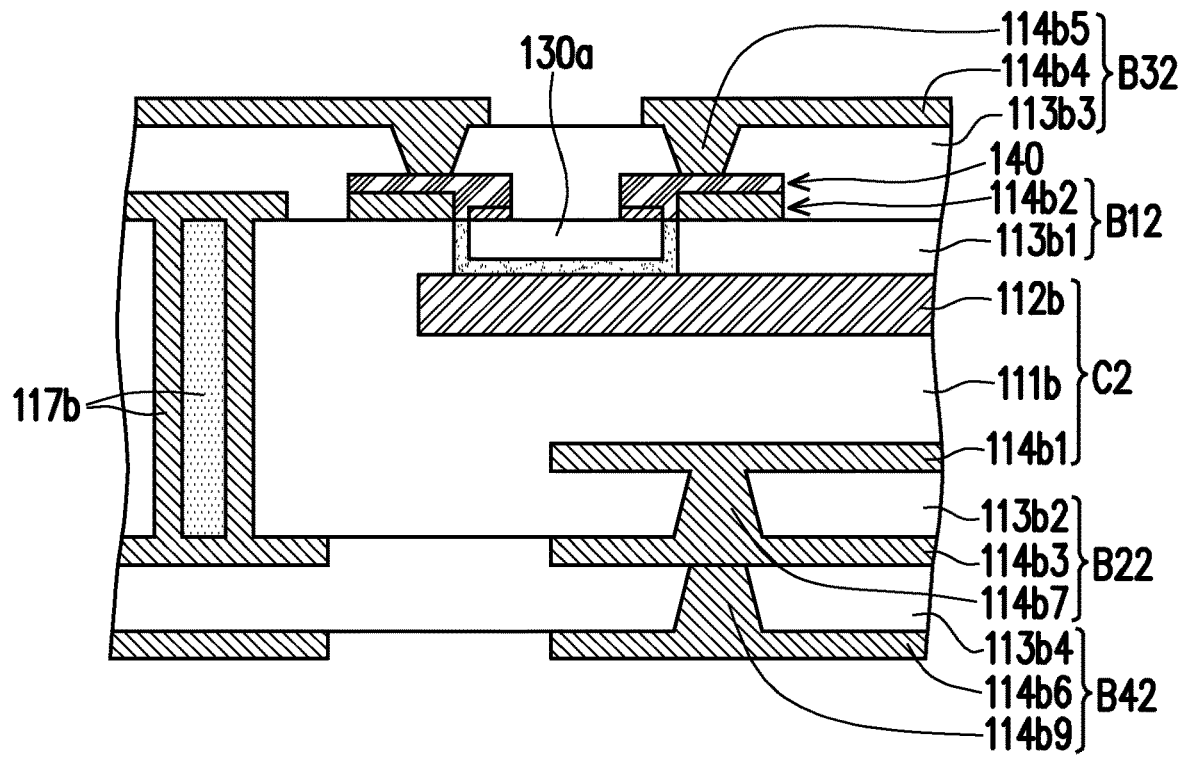

FIG. 2A to FIG. 2B are schematic cross-sectional views showing partial steps of a manufacturing method of a package structure according to another embodiment of the disclosure. After the step of FIG. 1B, please referring to FIG. 2A, a conductive via 117b is formed by laser drilling and electroplating to penetrate through a first dielectric layer 113b1 of a first build-up structure B12, a core layer 111b of a core substrate C2 and a second dielectric layer 113b2 of a second build-up structure B22. The second build-up structure B22 further includes a plurality of conductive vias 114b7, where a second build-up circuit layer 114b3 is electrically connected to an inner circuit layer 114b1 through the conductive vias 114b7. Following the steps of FIGS. 1C, 1D, 1E and 1F, the conductive via 117b electrically connects the first build-up circuit layer 114b2 and the second build-up circuit layer 114b3, and the conductive via 117b does not contact the composite material layer 112b.

Then, referring to FIG. 2B, a third build-up structure B32 is formed on the first build-up structure B12 by lamination, and a fourth build-up structure B42 is formed on the second build-up structure B22 by lamination. The third build-up structure B32 includes at least one dielectric layer (one dielectric layer 113b3 is schematically shown), at least one circuit layer (one circuit layer 114b4 is schematically shown), and a plurality of conductive vias 114b5, where the circuit layer 114b4 is electrically connected to the first build-up circuit layer 114b2 through the conductive vias 114b5. The fourth build-up structure B42 includes at least one dielectric layer (one dielectric layer 113b4 is schematically shown), at least one circuit layer (one circuit layer 114b6 is schematically shown), and a plurality of conductive vias 114b9, where the dielectric layer 113b4 is located between the second build-up circuit layer 114b3 and the circuit layer 114b6. So far, the package structure 100b with embedded components is completed, and the package structure 100b belongs to a heat-electricity separation structure.

FIG. 3A to FIG. 3E are schematic cross-sectional views of a manufacturing method of a package structure according to another embodiment of the disclosure. Please referring to FIG. 3A, a core substrate C3 is provided, where the core substrate C3 includes a composite material layer 112c, dielectric layers 113c1, 113c2, 113c3, and circuit layers 114c1, 114c2, 114c3. The dielectric layer 113c1 is located between the circuit layer 114c1 and the circuit layer 114c2. The circuit layers 114c1 and 114c2 are respectively patterned circuit layers, where the circuit layer 114c1 is electrically connected to the circuit layer 114c2 through a conductive via 117c. The dielectric layer 113c2 is located between the circuit layer 114c1 and the composite material layer 112c, and the dielectric layer 113c3 is located between the circuit layer 114c2 and the circuit layer 114c3.

Figure 3A:
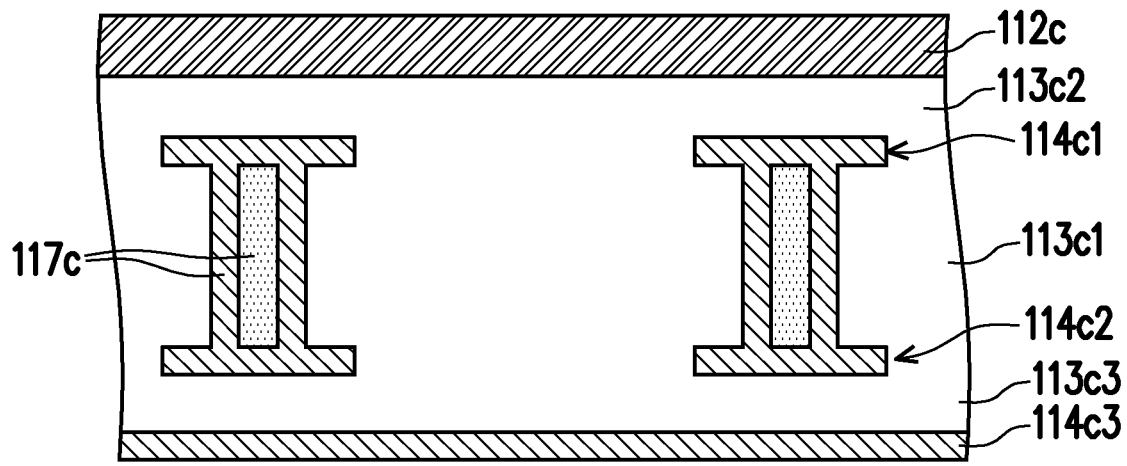
FIG. 3A to FIG. 3E are schematic cross-sectional views of a manufacturing method of a package structure according to another embodiment of the disclosure.
Figure 3B:
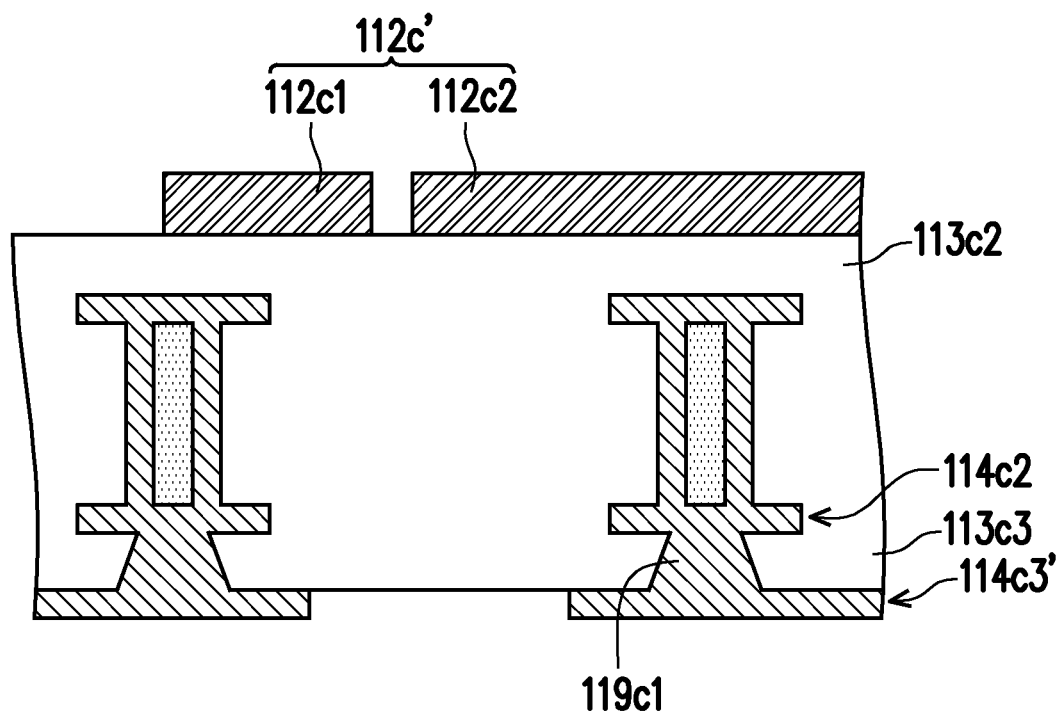

Then, referring to FIG. 3A and FIG. 3B at the same time, a laser process is performed to form a conductive via 119c1 to electrically connect the circuit layer 114c2 and the circuit layer 114c3. Then, a patterning process is performed to form a patterned composite material layer 112c' and a patterned circuit layer 114c3'. Here, the composite material layer 112c' includes a first composite material part 112c1 and a second composite material part 112c2 that are separated from each other. The composite material layer 112c' exposes a part of the dielectric layer 113c2, and the circuit layer 114c3' exposes a part of the dielectric layer 113c3.

Figure 3C:
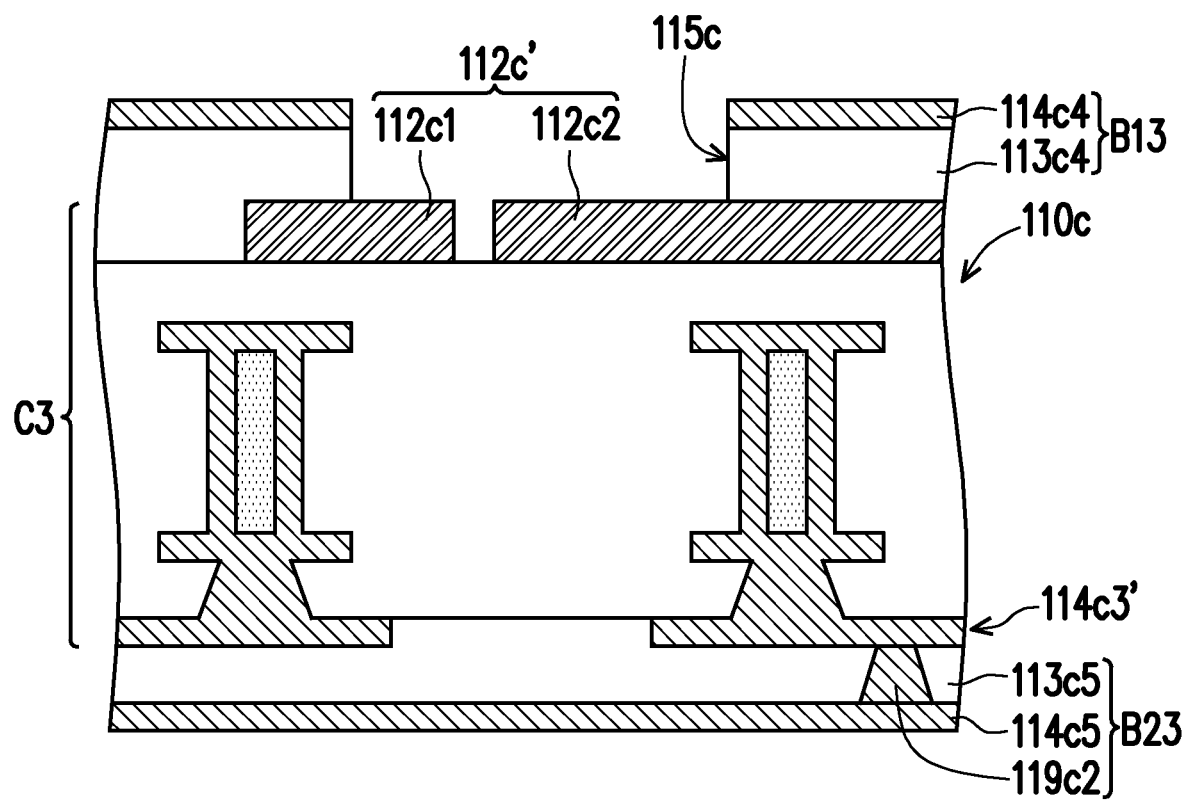

Then, referring to FIG. 3C, a first build-up structure B13 is formed on one side of the core substrate C3 by lamination. The first build-up structure B13 includes at least one first dielectric layer (one first dielectric layer 113c4 is schematically shown) and at least one first build-up circuit layer (one first build-up circuit layer 114c4 is schematically shown). The first dielectric layer 113c4 is located between the first build-up circuit layer 114c4 and the composite material layer 112c'. Then, a second build-up structure B23 is formed on the other side of the core substrate C3 by lamination. The second build-up structure B23 includes at least one second dielectric layer (one second dielectric layer 113c5 is schematically shown), a second build-up circuit layer (one second build-up circuit layer 114c5 is schematically shown), and at least one conductive via (one conductive via 119c2 is schematically shown). The second dielectric layer 113c5 is located between the second build-up circuit layer 114c5 and the circuit layer 114c3', and the second build-up circuit layer 114c5 is electrically connected to the circuit layer 114c3' through the conductive via 119c2.

Referring to FIG. 3C again, an opening 115c is formed to extend from the first build-up circuit layer 114c4 to the composite material layer 112c', and expose a part of the first composite material part 112c1 and a part of the second composite material layer 112c'.

Figure 3D:
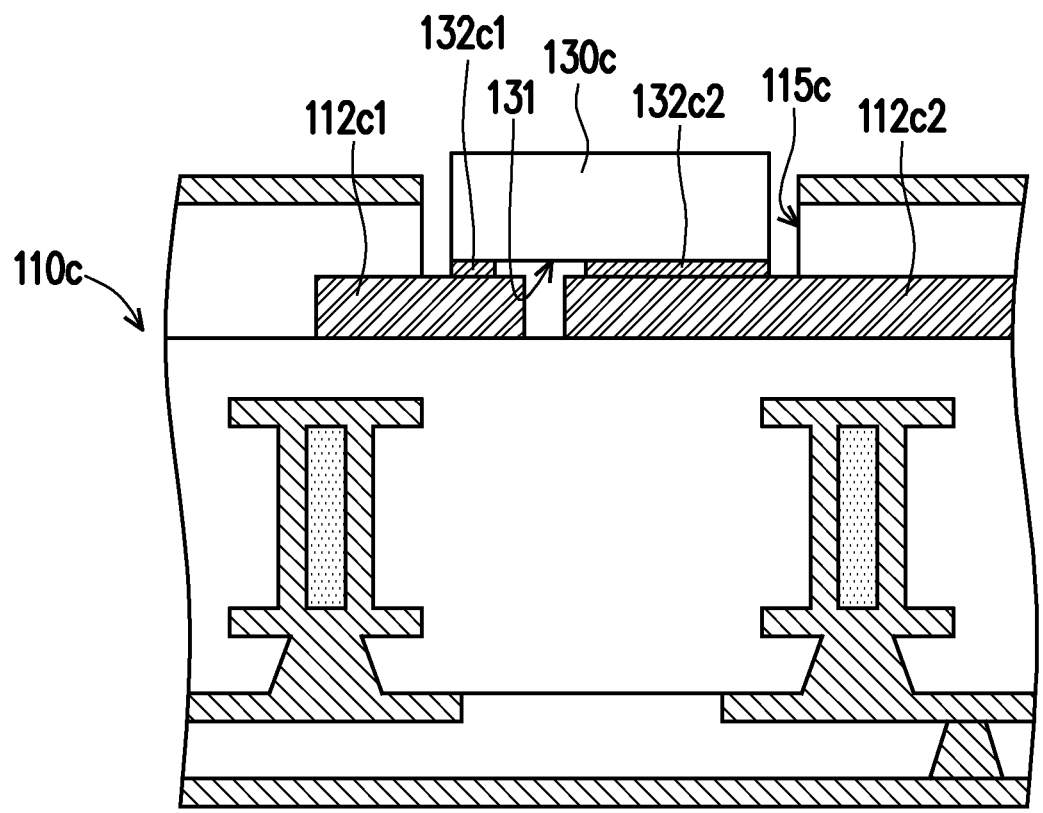

Then, referring to FIG. 3D, a heat generating element 130c is disposed in the opening 115c. The heat generating element 130c is disposed in the opening 115c with the active surface 131 facing downward, and a first electrode 132c1 is structurally and electrically connected to the first composite material part 112c1. A second electrode 132c2 is structurally and electrically connected to the second composite material part 112c2.

Figure 3E:
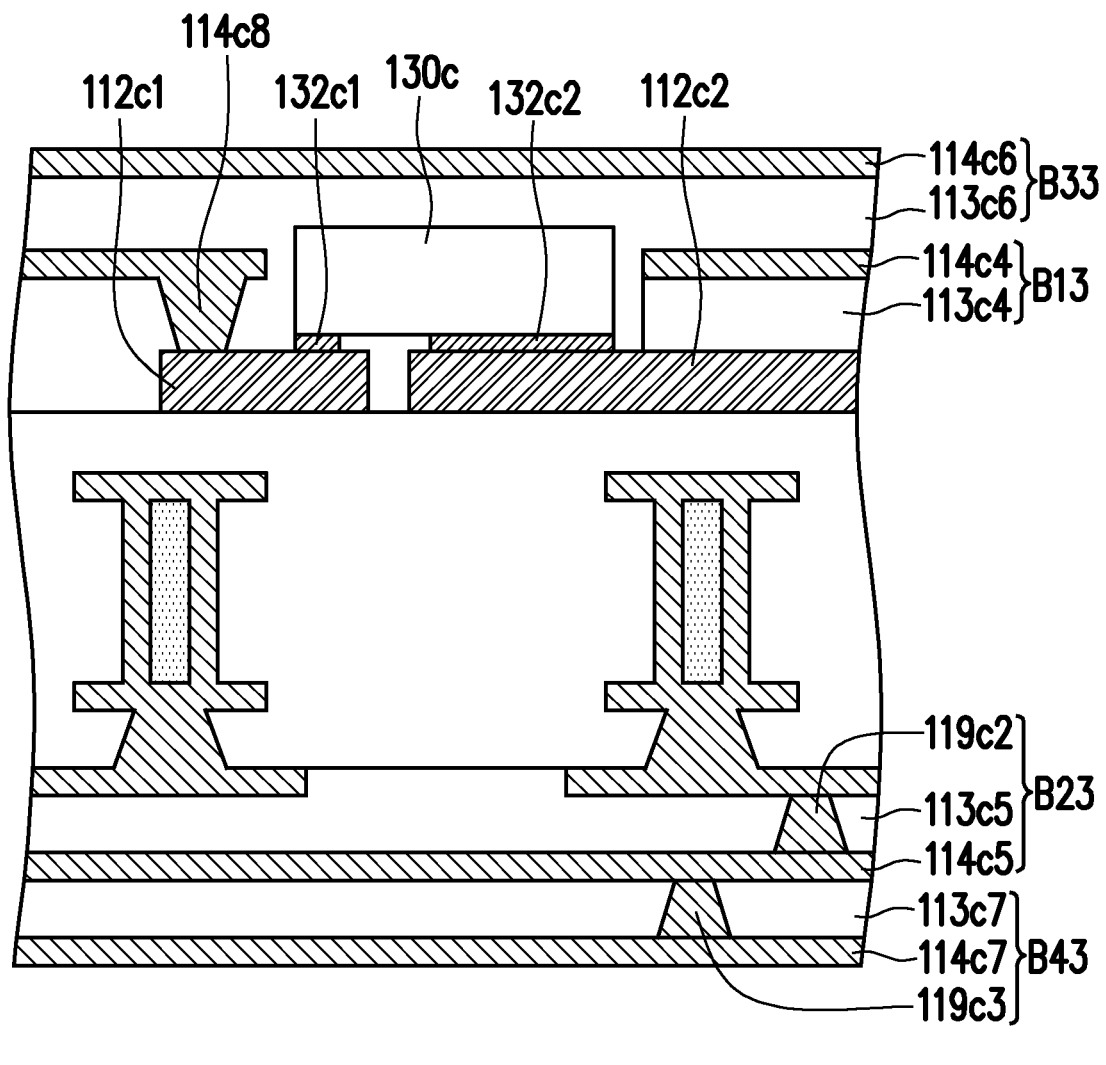

Finally, referring to FIG. 3E, a laser drilling process is performed to form a conductive via 114c8 to electrically connect the circuit layer 114c4 and the first composite material part 112c1 of the composite material layer 112c'. Then, a third build-up structure B33 is formed on the first build-up structure B13 by lamination, and a fourth build-up structure B43 is formed on the second build-up structure B23 by lamination. The third build-up structure B33 includes at least one dielectric layer (one dielectric layer 113c6 is schematically shown) and at least one circuit layer (one circuit layer 114c6 is schematically shown), where the dielectric layer 113c6 is located between the circuit layer 114c6 and the circuit layer 114c4, and covers the heat generating element 130c. The fourth build-up structure B43 includes at least one dielectric layer (one dielectric layer 113c7 is schematically shown), at least one circuit layer (one circuit layer 114c7 is schematically shown), and at least one conductive via (one conductive via 119c3 is schematically shown), where the dielectric layer 113c7 is located between the circuit layer 114c5 and the circuit layer 114c7, and the circuit layer 114c7 is electrically connected to the circuit layer 114c5 through the conductive via 119c3. So far, the package structure 100c with embedded components is completed.

In brief, in the package structure 100c of the embodiment, the first electrode 132c1 of the heat generating element 130c is electrically connected to the circuit layer 114c4 through the first composite material part 112c1 and the conductive via 114c8. Namely, the first composite material part 112c1 not only has the function of heat dissipation, but also has the function of conducting electricity. The heat generated by the heat generating element 130c may be transferred to the external environment through the composite material layer 112c' which is in direct contact with the second electrode 132c2. In other words, the package structure 100c of the embodiment may be regarded as a structure that combines heat and electricity. In addition to quickly transferring the heat generated by the heat generating element 130c to the external environment, the package structure 100c may also have better electrical conductivity.

FIG. 4A to FIG. 4D are schematic cross-sectional views of a manufacturing method of a package structure according to another embodiment of the disclosure. Regarding the manufacturing method of the package structure of the embodiment, first, please referring to FIG. 4A, a core substrate C4 is provided. The core substrate C4 includes a core dielectric layer 111d, and a first circuit layer 114d1 and a second circuit layer 114d2 located on two opposite sides of the core dielectric layer 111d. Here, the first circuit layer 114d1 and the second circuit layer 114d2 are respectively patterned circuit layers.

Then, referring to FIG. 4A again, a first build-up structure B14 is formed on the first circuit layer 114d1 of the core substrate C4 by lamination. The first build-up structure B14 includes a first dielectric layer 113d1 and a composite material layer 112d, where the first dielectric layer 113d1 is located between the composite material layer 112d and the first circuit layer 114d1. Then, a second build-up structure B24 is formed on the second circuit layer 114d2 of the core substrate C4 by lamination. The second build-up structure B24 includes a second dielectric layer 113d2 and a third circuit layer 114d3. The second dielectric layer 113d2 is located between the second circuit layer 114d2 and the third circuit layer 114d3. Namely, the plurality of circuit layers include the first circuit layer 114d1, the second circuit layer 114d2, and the third circuit layer 114d3.

Figure 4A:
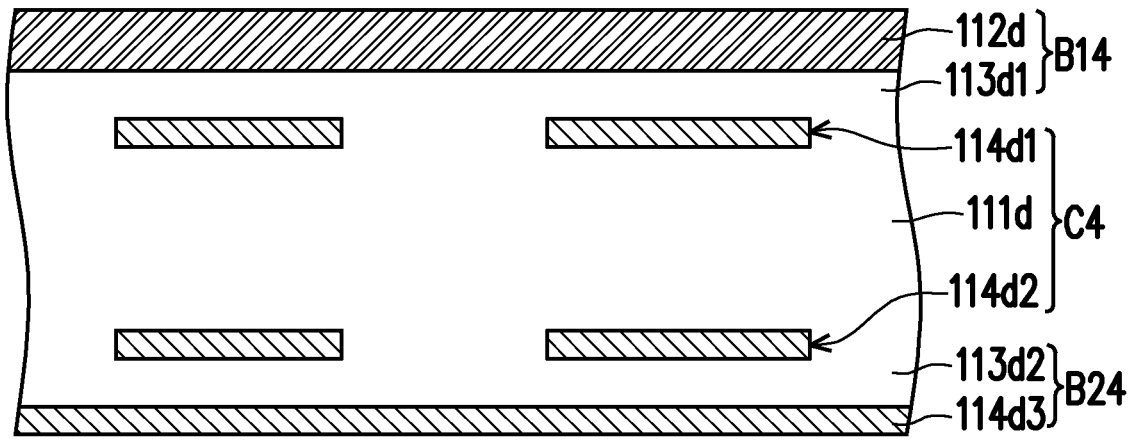
FIG. 4A to FIG. 4D are schematic cross-sectional views of a manufacturing method of a package structure according to another embodiment of the disclosure.
Figure 4B:
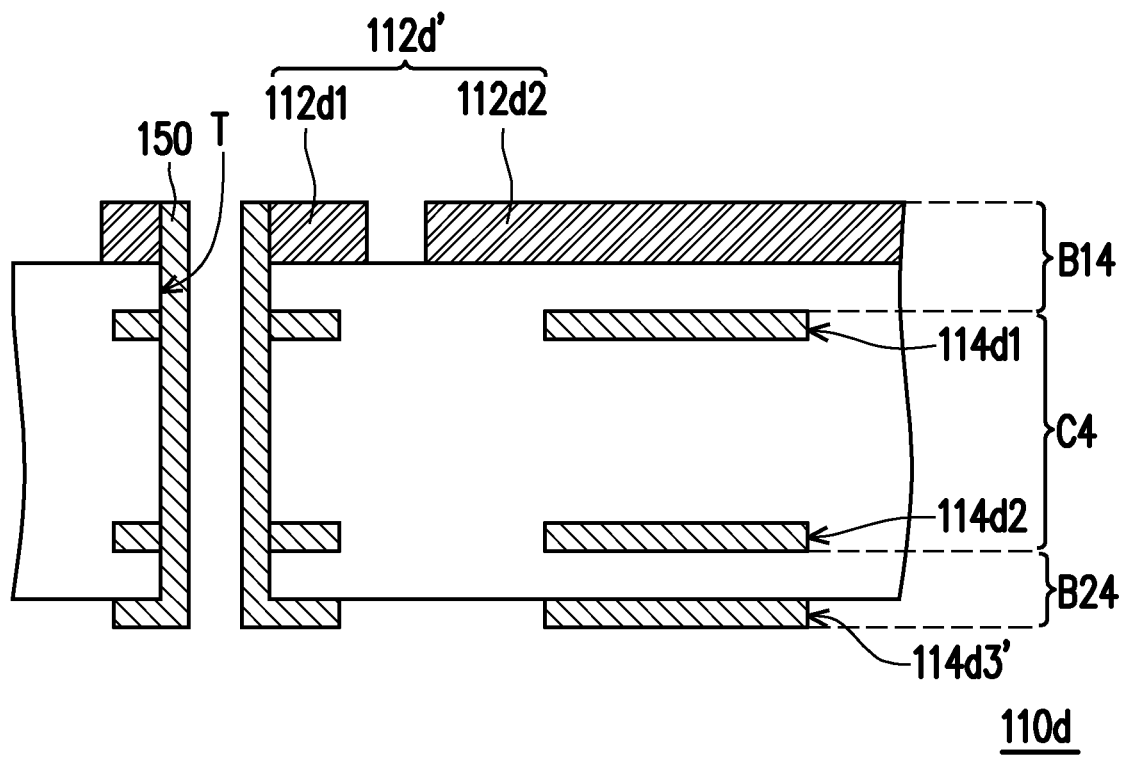

Then, referring to FIG. 4B, a patterning process is performed on the composite material layer 112d and the third circuit layer 114d3 to form a patterned composite material layer 112d' and a patterned third circuit layer 114d3'. Here, the composite material layer 112d' includes a first composite material part 112d1 and a second composite material part 112d2 that are separated from each other. Then, a through hole T is formed to penetrate through the first build-up structure B14, the core substrate C4 and the second build-up structure B24. Then, a conductive connection layer 150 is formed on an inner wall of the through hole T and electrically connected to the composite material layer 112d', the first circuit layer 114d1, the second circuit layer 114d2, and the third circuit layer 114d3' by electroplating. So far, manufacturing of the circuit board 110d is completed.

Figure 4C:
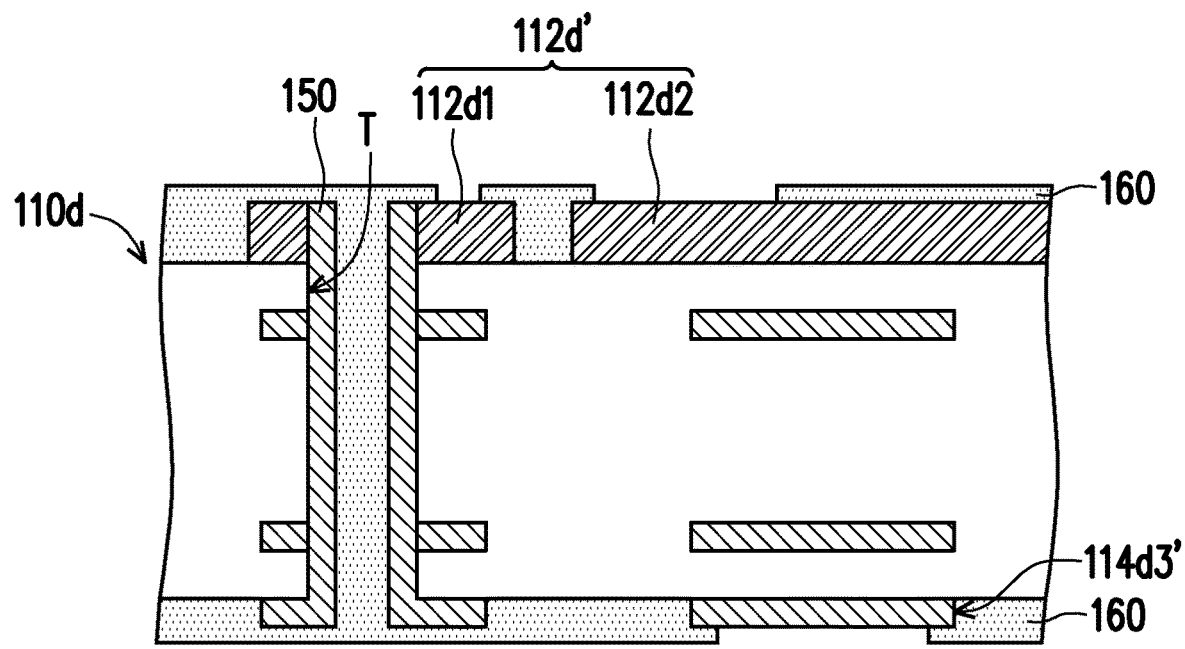

Thereafter, referring to FIG. 4C, a solder mask 160 is formed on the circuit board 110d by printing. The solder mask 160 fills the through hole T and covers the conductive connection layer 150, the composite material layer 112d' and the third circuit layer 114d3', and exposes a part of the composite material layer 112d' and a part of the third circuit layer 114d3'. To be specific, the solder mask 160 exposes a part of the first composite material part 112d1 and a part of the second composite material part 112d2 of the composite material layer 112d'.

Figure 4D:
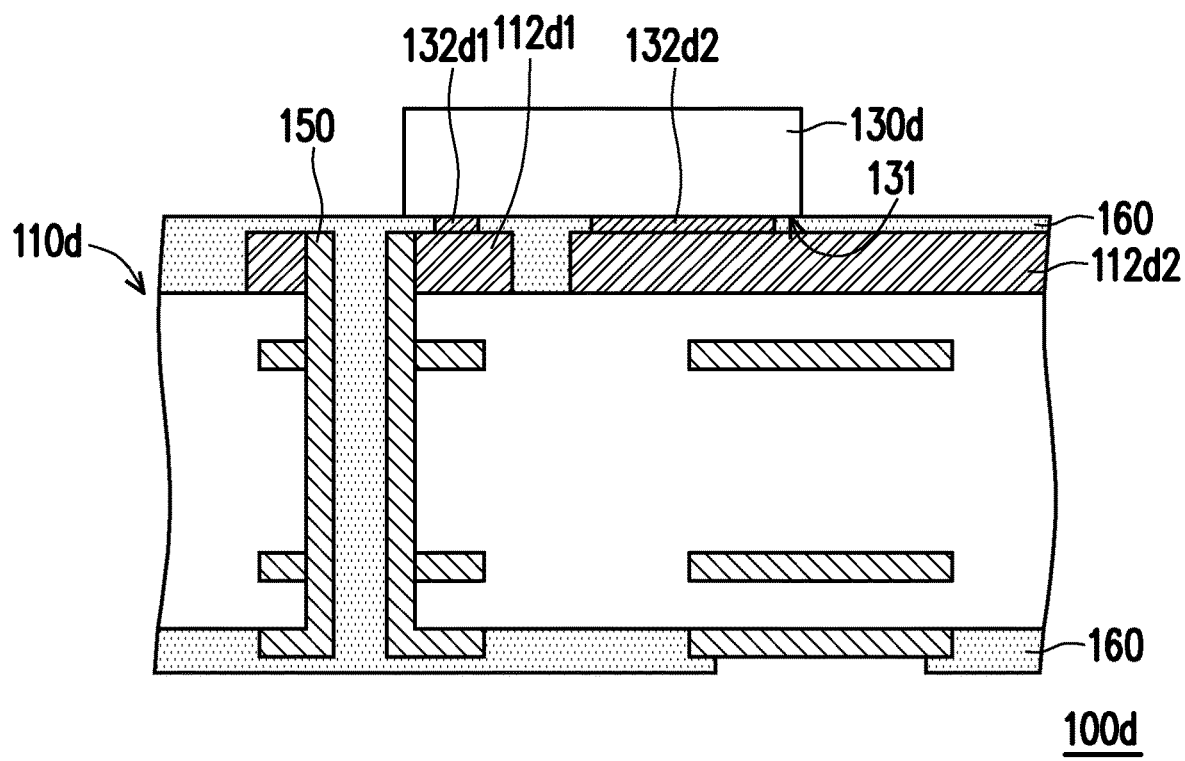

Finally, referring to FIG. 4D, a heat generating element 130d is arranged on the composite material layer 112d' exposed by the solder mask 160. The heat generating element 130d is disposed on the circuit board 110d with the active surface 131 facing downward, where a first electrode 132d1 is structurally and electrically connected to the first composite material part 112d1, and a second electrode 132d2 is structurally connected to the second composite material part 112d2. In other words, the first electrode 132d1 and the second electrode 132d2 are all in direct contact with the composite material layer 112d', but the first electrode 132d1 and the second electrode 132d2 are not connected to each other. So far, the manufacture of the package structure 100d is completed.

In brief, in the package structure 100d of the embodiment, the first electrode 132d1 of the heat generating element 130d may be electrically connected to the conductive connection layer 150 through the first composite material part 112d1. Namely, the first composite material part 112d1 not only has the function of conducting heat, but also has the function of conducting electricity. The heat generated by the heat generating element 130d may be transferred to the external environment through the second composite material part 112d2 that directly contacts the second electrode 132d2. In other words, the package structure 100d of the embodiment may be regarded as a structure that combines heat and electricity. In addition to quickly transferring the heat generated by the heat generating element 130d to the external environment, the package structure 100d may also have better electrical conductivity.

In summary, in the design of the package structure of the disclosure, the circuit board includes the composite material layer with a thermal conductivity between 450 W/mK and 700 W/mK, and the heat generated by the heat generating element may be transferred to the external environment through the composite material layer. Namely, the package structure of the disclosure transfers the heat generated by the heat generating element to the external environment in a horizontal direction through the composite material layer with the thermal conductivity greater than that of copper (400 W/mK), so that in addition to quickly transferring the heat to the external environment, better heat dissipation efficiency is also achieved.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A package structure, comprising:
    a circuit board, comprising a plurality of circuit layers and a composite material layer, wherein a thermal conductivity of the composite material layer is between 450 W/mK and 700 W/mK; and
    a heat generating element, disposed on the circuit board, and electrically connected to the plurality of circuit layers, wherein heat generated by the heat generating element is transferred to an external environment through the composite material layer,
    wherein the plurality of circuit layers comprises an inner circuit layer, at least one first build-up circuit layer and at least one second build-up circuit layer, the circuit board comprises:
    a core substrate, comprising a core layer, the composite material layer and the inner circuit layer, wherein the composite material layer and the inner circuit layer are respectively located on two opposite sides of the core layer;
    a first build-up structure, disposed on one side of the core substrate and comprising at least one first dielectric layer, the at least one first build-up circuit layer and an opening, wherein the at least one first dielectric layer is located between the at least one first build-up circuit layer and the composite material layer, and the opening extends from the at least one first build-up circuit layer to the composite material layer and exposes a part of the composite material layer, and the heat generating element is disposed in the opening; and
    a second build-up structure, disposed on an other one side opposite to the one side of the core substrate and comprising at least one second dielectric layer and the at least one second build-up circuit layer, wherein the at least one second dielectric layer is located between the at least one second build-up circuit layer and the inner circuit layer.

2. The package structure as claimed in claim 1, wherein the composite material layer comprises a first material and a second material, and a thermal conductivity of the first material is greater than a thermal conductivity of the second material.

3. The package structure as claimed in claim 2, wherein the first material is graphene, and the second material is copper.

4. The package structure as claimed in claim 1, further comprising:
    an insulating adhesive layer, arranged between the opening and the heat generating element, wherein the heat generating element has an active surface and a back surface opposite to each other, and a peripheral surface connecting the active surface and the back surface, and comprises a first electrode and a second electrode on the active surface, the insulating adhesive layer covers the back surface and the peripheral surface of the heat generating element, and the heat generating element contacts the composite material layer through the insulating adhesive layer; and
    an electrical connection layer, connecting the at least one first build-up circuit layer and the first electrode of the heat generating element, and connecting the at least one first build-up circuit layer and the second electrode of the heat generating element, wherein the electrical connection layer exposes a part of the active surface of the heat generating element and a part of the at least one first dielectric layer of the first build-up structure.

5. The package structure as claimed in claim 4, further comprising:
    a conductive via, penetrating through the at least one first dielectric layer of the first build-up structure, the core layer of the core substrate, and the at least one second dielectric layer of the second build-up structure, and electrically connecting the at least one first build-up circuit layer and the at least one second build-up circuit layer.

6. The package structure as claimed in claim 1, wherein the heat generating element has an active surface and a back surface opposite to each other, and comprises a first electrode and a second electrode on the active surface, the composite material layer comprises a first composite material part and a second composite material part separated from each other, the first electrode is structurally and electrically connected to the first composite material part, and the second electrode is structurally and electrically connected to the second composite material part.

7. The package structure as claimed in claim 1, further comprising:
   a third build-up structure, disposed on the first build-up structure, and electrically connected to the at least one first build-up circuit layer; and
   a fourth build-up structure, disposed on the second build-up structure, and electrically connected to the at least one second build-up circuit layer.

8. A manufacturing method of a package structure, comprising:
   providing a circuit board, the circuit board comprising a plurality of circuit layers and a composite material layer, wherein a thermal conductivity of the composite material layer is between 450 W/mK and 700 W/mK; and
   disposing a heat generating element on the circuit board, the heat generating element being electrically connected to the plurality of circuit layers, wherein heat generated by the heat generating element is transferred to an external environment through the composite material layer,
   wherein the plurality of circuit layers comprise an inner circuit layer, at least one first build-up circuit layer and at least one second build-up circuit layer, and the step of providing the circuit board comprises:
   providing a core substrate, the core substrate comprising a core layer, the composite material layer and the inner circuit layer, wherein the composite material layer and the inner circuit layer are respectively located on two opposite sides of the core layer;
   forming a first build-up structure on one side of the core substrate, the first build-up structure comprising at least one first dielectric layer and the at least one first build-up circuit layer, wherein the first dielectric layer is located between the at least one first build-up circuit layer and the composite material layer;
   forming an opening to extend from the at least one first build-up circuit layer to the composite material layer and expose a part of the composite material layer; and
   forming a second build-up structure on an other side opposite to the one side of the core substrate, the second build-up structure comprising at least one second dielectric layer and the at least one second build-up circuit layer, wherein the at least one second dielectric layer is located between the at least one second build-up circuit layer and the inner circuit layer.

9. The manufacturing method of the package structure as claimed in claim 8, wherein the composite material layer comprises a first material and a second material, and a thermal conductivity of the first material is greater than a thermal conductivity of the second material.

10. The manufacturing method of the package structure as claimed in claim 9, wherein the first material is graphene, and the second material is copper.

11. The manufacturing method of the package structure as claimed in claim 8, further comprising:
   providing an insulating adhesive layer in the opening after the opening is formed and before the heat generating element is disposed on the circuit board;
   disposing the heat generating element in the opening, wherein the heat generating element has an active surface and a back surface opposite to each other, and a peripheral surface connecting the active surface and the back surface, and comprises a first electrode and a second electrode on the active surface, the insulating adhesive layer covers the back surface and the peripheral surface of the heat generating element, and the heat generating element contacts the composite material layer through the insulating adhesive layer; and
   forming an electrical connection layer to connect the at least one first build-up circuit layer and the first electrode of the heat generating element and connect the at least one first build-up circuit layer and the second electrode of the heat generating element, wherein the electrical connection layer exposes a part of the active surface of the heat generating element and a part of the at least one first dielectric layer of the first build-up structure.

12. The manufacturing method of the package structure as claimed in claim 11, further comprising:
   forming a conductive via to penetrate through the at least one first dielectric layer of the first build-up structure, the core layer of the core substrate, and the at least one second dielectric layer of the second build-up structure, wherein the conductive via electrically connects the at least one first build-up circuit layer and the at least one second build-up circuit layer.

13. The manufacturing method of the package structure as claimed in claim 8, wherein the step of disposing the heat generating element on the circuit board comprises:
   disposing the heat generating element in the opening, wherein the heat generating element has an active surface and a back surface opposite to each other, and comprises a first electrode and a second electrode on the active surface, the composite material layer comprises a first composite material part and a second composite material part separated from each other, the first electrode is structurally and electrically connected to the first composite material part, and the second electrode is structurally and electrically connected to the second composite material part.

14. The manufacturing method of the package structure as claimed in claim 8, further comprising:
   forming a third build-up structure on the first build-up structure after the first build-up structure is formed, wherein the third build-up structure is electrically connected to the at least one first build-up circuit layer; and
   forming a fourth build-up structure on the second build-up structure after the second build-up structure is formed, wherein the second build-up structure is electrically connected to the at least one second build-up circuit layer.

\* \* \* \* \*